United States Patent [19]

Oldfield

[11] Patent Number: 6,049,212

[45] Date of Patent: Apr. 11, 2000

[54] CONNECTOR SAVING ADAPTERS AND SWR BRIDGE CONFIGURATION ALLOWING MULTIPLE CONNECTOR TYPES TO BE USED WITH A SINGLE SWR BRIDGE

[75] Inventor: William W. Oldfield, Redwood City, Calif.

[73] Assignee: Wiltron Company, Morgan Hill, Calif.

[21] Appl. No.: 08/504,964

[22] Filed: Jul. 20, 1995

[51] Int. Cl.⁷ ................................................. G01R 27/00
[52] U.S. Cl. .................... 324/648; 324/725; 324/601; 333/25; 333/32
[58] Field of Search ................................. 324/648, 725, 324/601; 333/32, 25

[56] References Cited

U.S. PATENT DOCUMENTS

| | | | |
|---|---|---|---|
| 2,650,347 | 8/1953 | Gaffney | 324/648 |
| 3,800,218 | 3/1974 | Shekel | 324/725 |
| 4,278,932 | 7/1981 | Tait | 324/725 |
| 5,461,322 | 10/1995 | Bey | 324/725 |

OTHER PUBLICATIONS

Pollard, Roger D., *Compensation Technique Improves Measurements for a Range of Mechanically Compatible Connectors,* Microwave Journal, Oct. 1994, pp. 91–99.

*Present–Day Simplicity in Broadband SWR Measurements,* Wiltron Technical Review, (month unavailable) 1972, vol. 1, No. 1., pp. 1–3.

*Primary Examiner*—Kenneth A. Wieder
*Assistant Examiner*—Jose M. Solis
*Attorney, Agent, or Firm*—Fliesler, Dubb, Meyer & Lovejoy

[57] ABSTRACT

An SWR bridge with an accompanying set of connector saving adapters for connecting between the test port of the SWR bridge and a test device. The SWR bridge includes a branch opposite the test port which has an impedance set to substantially compensate for the impedance of the connector saving adapters. The connector saving adapters are configured to mate with connectors from two groups of test device connectors in both male and female versions, a first group including 3.5 mm, SMA and 2.92 mm connectors, and a second group including 2.5 mm and 1.85 mm connectors. To compensate for any capacitive mismatch between an adapter configured for a particular group of connectors and a given connector type, either a center conductor pin setback, an inductive counter bore in the outer conductor of the adapter, or a combination of the center pin setback and inductive counter bore may be utilized.

26 Claims, 6 Drawing Sheets

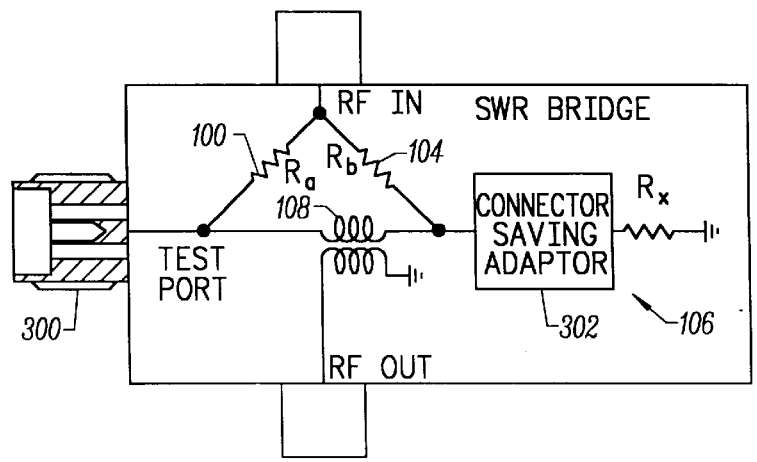
FIG. 3
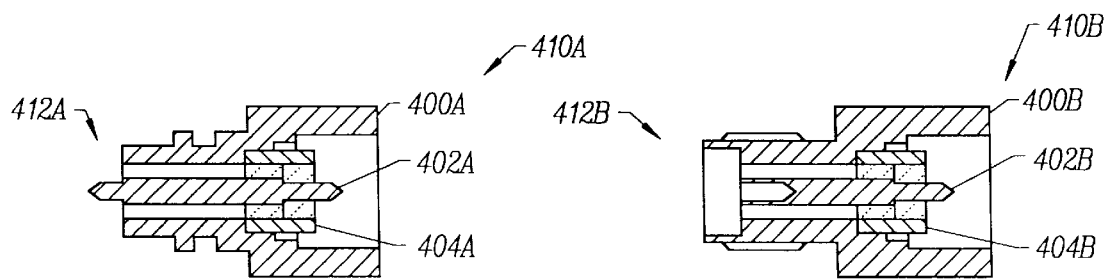
FIG. 4A
FIG. 4B

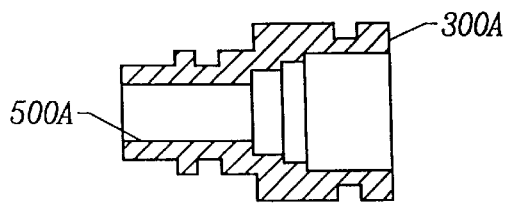
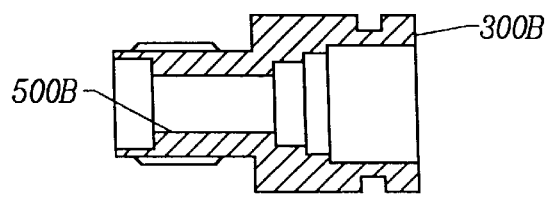
FIG. 5A  FIG. 5B
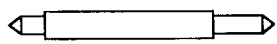
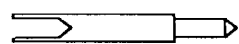
FIG. 6A  FIG. 6B
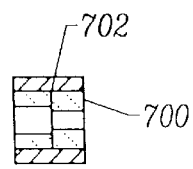
FIG. 7

CONNECTOR SAVING ADAPTERS AND SWR BRIDGE CONFIGURATION ALLOWING MULTIPLE CONNECTOR TYPES TO BE USED WITH A SINGLE SWR BRIDGE

BACKGROUND OF THE INVENTION

1. Field of the Invention

The present invention relates to an SWR bridge, also known as a microwave impedance bridge, or a directional bridge. More particularly, the present invention relates to components utilized to prevent degradation of connectors on the SWR bridge, and to enable more than one connector type to be used with the SWR bridge.

2. Description of the Related Art

FIG. 1A shows circuitry for a conventional SWR bridge. As shown, the SWR bridge has a first branch including an impedance element 100 having an impedance value Ra. The first branch element 100 is connected to an RF IN input to an SWR bridge to receive the RF input signal. A second branch includes test port 102 which connects a device under test with an arbitrary impedance between the first branch element 100 and ground. A third branch includes an impedance element 104 having an impedance Rb. The third branch element 104 is connected to the RF IN input to receive the RF input signal, similar to element 100. A fourth branch includes an element 106 having a value Rx. The fourth branch element 106 is connected between the third branch element 104 and ground. The SWR bridge of FIG. 1A also includes a balun 108 which provides an impedance of value Re between the branches as shown. The output of balun forms the SWR bridge output, RF OUT, and provides an RF signal proportional to the voltage difference between the connection of elements 100 and 102 to the connection of elements 104 and 106.

FIG. 1B shows another configuration of an SWR bridge which provides a DC output. As shown, the SWR bridge of FIG. 1B replaces the balun 108 of FIG. 1A with a detector 208. Detector 208, like balun 108, provides an impedance Re between branches of the SWR bridge. The output of detector 208 forms the SWR bridge output, DC OUT, and provides a DC signal proportional to the voltage difference between the connection of elements 100 and 102 to the connection of elements 104 and 106.

The SWR bridges of FIGS. 1A and 1B are configured similar to a Wheatstone bridge which is utilized to measure an unknown impedance using signals below microwave frequencies. With a Wheatstone bridge, to determine the impedance of a device under test connected to test port 102, element 106 would be a variable resistance device, while the values of Ra, Rb and Re would be set to a common value Ro, Ro typically being 50Ω. The impedance of element 106 would be varied until no voltage difference (or a null point) is measured at the SWR bridge output, RF OUT. At the null point, element 106 and a test device connected to test port 102 would have an equal impedance.

For microwave impedance measurements, it has been recognized that the voltage measured at the SWR bridge RF output can be utilized to determine the reflection coefficient, or VSWR of a device under test with the bridge unbalanced, or without a null point being determined. See "Present-Day Simplicity in Broadband SWR Measurements", *Wiltron Technical Review*, published by Wiltron Company in 1972, pp. 1–3 (hereinafter, 1972 Wiltron publication). In the 1972 Wiltron publication, SWR is calculated from the measured voltage from the SWR bridge output with element 106 being a precision reference termination, and with the element 106 as well as elements 100, 104 and the element with a value Re having a common impedance value Ro.

FIG. 2 shows a block diagram of equipment configured for making scaler measurements with the SWR bridge of FIG. 1A. As shown, the RF IN signal at the RF IN port is provided to the SWR bridge 200 of FIG. 1A from an RF sweep generator 202 over a range of frequencies. The device under test 204 is connected to the test port of the SWR bridge 200, and a diode detector 206 is connected to the output of the SWR bridge. The diode detector 206 converts the AC output of the SWR bridge to a DC voltage value. The DC voltage from the diode detector 206 can then be read from the output of the diode detector 206 using a voltage level meter 208, or a device enabling similar voltage level measurements such as an oscilloscope. Note that the SWR bridge of FIG. 1B can be utilized with a direct connection from the SWR bridge output to the voltage level meter 208 since a diode detector is included in the SWR bridge of FIG. 1B.

One problem with current SWR bridges is the wearing out of the connector on the test port of the SWR bridge. Wear of the test port connector degrades the measurement accuracy of the SWR bridge.

To prevent the connector on the test port of the SWR bridge from wearing out, adapters may be connected between the test port connector of the SWR bridge and devices to be tested. Once an adapter begins to wear, it can then be replaced by another adapter without requiring replacement of the entire microwave component.

Utilizing adapters, however, will degrade the performance of the SWR bridge because the return loss of the adapter is additive to the return loss being measured. For example, a high quality SWR bridge may have 30 dB of directivity, but adapters may drop the directivity to 20 dB. Some components to be measured may have a return loss below 20 dB, making utilization of an adapter impractical.

Another problem with current SWR bridges is the multiplicity of connector types which may be utilized at the test port of the SWR bridge to mate with a connector of a device to be tested. For example, some connectors which may be utilized at the test port include SMA, 3.5 mm, 2.92 mm, 2.5 mm and 1.85 mm connectors. Further, each of these connectors include male and female versions, creating a selection of ten possible connectors for use on the test port of an SWR bridge with the connector types indicated above. The different connectors may not mechanically mate, and if they do mechanically mate, an electrical mismatch will result. Utilizing an adapter between the test port connector and the connector of a device under test to provide mechanical and/or electrical compatibility may unacceptably degrade the performance of the SWR bridge, as indicated above. Thus, a user may need to acquire a separate SWR bridge for each type of connector.

One way to prevent the need for a different SWR bridge for each connector type without significantly degrading performance is to measure SWR of a device through the SWR bridge using a vector network analyzer (VNA), instead of using a detector and voltmeter to provide scaler measurements. The VNA can then be programmed or calibrated to cancel out the mismatch of any adapter. See Daw, "Improved Accuracy of Vector Measurements for SMA Components", *Microwave and RF,* August 1988; Pollard, "Compensation Technique Improves Measurements for a Range of Mechanically Compatible Connectors", *Microwave Journal,* October 1994, pp. 91–99.

However, an SWR bridge configured to provide measurements in a scaler mode may still be desirable over vector measurements using a VNA. First, the SWR bridge is typically utilized as a lower cost alternative to the VNA. Additionally, the SWR bridge operating in a scaler mode provides more rapid measurements as opposed to vector mode, the faster measurements being desirable, for instance, during tuning. Further, calibration software for the VNA to cancel out the mismatch of an adapter is cumbersome, and will require a new calibration for each different connector type utilized with the SWR bridge.

SUMMARY OF THE INVENTION

The present invention enables utilization of a connector saving adapter on an SWR bridge to make scaler measurements with the SWR bridge configured so that a connector saving adaptor does not degrade performance of the SWR bridge.

The present invention also enables utilization of a single SWR bridge with a different connector saving adapter for each connector type without the adapters further substantially degrading performance of the SWR bridge.

The present invention also enables vector measurements using an SWR bridge connected to a VNA without requiring recalibration of the VNA when different connector saving adapters are utilized.

The present invention includes an SWR bridge configured similar to those illustrated in either FIG. 1A or FIG. 1B with an accompanying set of connector saving adapters for connecting between the test port of the SWR bridge and a test device. In the present invention, the impedance of branch element 106 is set to substantially compensate for the impedance, and thus return loss of the connector saving adapters.

The connector saving adapters are configured to mate with connectors from two groups of connector types in both male and female versions, a first group including 3.5 mm, SMA and 2.92 mm connectors, and a second group including 2.5 mm and 1.85 mm connectors. To compensate for any capacitive mismatch between an adapter configured for a particular group of connectors and a given connector type, either a center conductor pin setback, an inductive counter bore in the outer conductor of an adapter, or a combination of the center pin setback and inductive counter bore may be utilized. Because the impedance of an extra step interface must be added to a branch of an SWR bridge to compensate between a first group of connectors and a second group of connectors, compensation can be fully provided in the SWR bridge for the first group of connectors while compensation is only substantially provided for the second group.

BRIEF DESCRIPTION OF THE DRAWINGS

Further details of the present invention are explained with the help of the attached drawings in which:

FIG. 3 shows an SWR bridge of the present invention with internal components illustrated;

FIGS. 4A and 4B show the cross sections of respective female and male connector saving adapters of the present invention;

FIGS. 5A and 5B show cross sections of the outer conductors of the connector saving adapters of FIGS. 4A and 4B;

FIGS. 6A and 6B show the center conductor portions of the connector saving adapters of FIGS. 4A and 4B;

FIG. 7 shows a cross section of the support bead assembly of the respective connector saving adapters of FIGS. 4A and 4B;

DETAILED DESCRIPTION

Figure 1A:
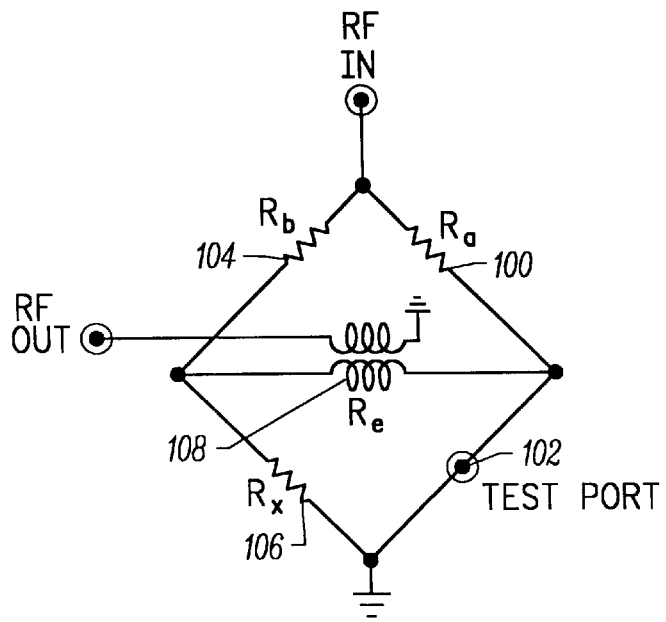
FIG. 1A shows circuitry for a conventional SWR bridge.
Figure 1B:
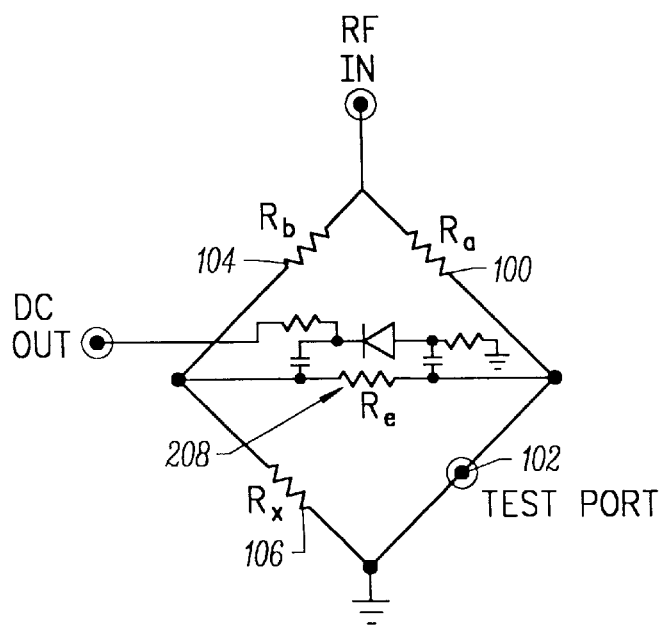
FIG. 1B shows another configuration of an SWR bridge which provides a DC output.

The present invention includes an SWR bridge configured as shown in either FIG. 1A or FIG. 1B with one or more accompanying connector saving adapters for connecting between the test port of the SWR bridge and a test device.

To compensate for any mismatch of a particular connector saving adapter, the present invention begins by utilizing an identical compensating impedance on the branch of the SWR bridge opposite the test port connector. The present invention utilizes such a compensating impedance in the configuration shown in either FIG. 1A or FIG. 1B by providing elements 100, 104 and the element with a value Re with a common impedance value Ro and element 106 with an impedance value Ro plus the impedance of a connector saving adaptor. The SWR of the device under test is then determined by measuring the voltage from the SWR bridge output utilizing the calculation provided in the 1972 Wiltron publication, discussed above. The additional impedance of element 106 above Ro serves to compensate for the impedance mismatch of the connector saving adapter.

FIG. 3 shows one embodiment of an SWR bridge of the present invention with internal components illustrating how compensation is provided in the SWR bridge for a connector saving adapter. As shown, the SWR bridge includes internal components similar to those of FIG. 1A, but with element 106 including one of the connector saving adapters 302 of the present invention provided in the circuit in series with the impedance Rs. By including one of the connector saving adapters 302 in the circuit, specific impedance matching of a single impedance element to assure that element 106 has the standard impedance Ro, described above, plus the specific connector saving adapter impedance is not required. Although the circuit of FIG. 3 utilizes the circuit of FIG. 1A, it is understood that the connector saving adapter 302 might similarly be included in the circuitry of FIG. 1B to provide compensation.

The present invention provides both male and female versions of a connector saving adapter to be used for a single SWR bridge with compensation for the adapter return loss with the recognition that reflection from a male-female interface is the same as that of a female-male interface.

The present invention further enables additional adapters to be used for a single SWR bridge with compensation for the adapter return loss by recognizing that particular groups of connectors will mate mechanically with only a capacitive mismatch, and that the capacitive mismatch can be compensated utilizing a center conductor pin setback, or an inductive counter bore in an outer conductor of an adapter.

A first group of connectors which mechanically mate include 3.5 mm, SMA and 2.92 mm connectors. A second group of connectors which mechanically mate include 2.5 mm and 1.85 mm connectors.

FIGS. 4A and 4B show the cross sections of respective male and female connector saving adapters of the present invention which can mechanically mate with connectors in one particular group. As shown, the connector saving adapters include respective outer conductors 400A and 400B, respective inner conductor pins 402A and 402B, and respective support bead assemblies 404A and 404B.

Respective first ends of the adapters 410A and 410B mechanically mate with the test port connector of an SWR bridge, such as the test port connection 300 shown in cross section in FIG. 3. Although the test port connector 300 in FIG. 3 is shown with a female type center conductor pin to mate with a male type center conductor pin of the adapters of FIG. 4A and FIG. 4B, the adapters and test port may be configured to have pins of the opposite sex.

A second end 412A of the adapter of FIG. 4A is configured as a male connector to mate with a female connector in the particular group of connector types. A second end 412B of the adapter of FIG. 4B is configured as a female connector to mate with a male connector in the particular group.

FIGS. 5A and 5B show cross sections of the outer conductors 400A and 400B of the connector saving adapters of FIGS. 4A and 4B. The outer conductors 400A and 400B include respective interior conducting portions 500A and 500B with identical bore diameters for connectors in one particular group. The interior conducting portions 500A and 500B have the same bore diameter as the bore of the interior conducting portion of the test port connector of the SWR bridge to which they attach to enable an electrical match. The interior conducting portions 500A and 500B may or may not have the same bore diameter as an interior conducting portion of a connector in one particular group.

FIGS. 6A and 6B show the center conductor portions 402A and 402B of the connector saving adapters of FIGS. 4A and 4B, respectively. As with the outer conductor bores 500A and 500B, the center conductors of all adapters for one particular group of connectors have diameters matching the diameter of the test port connector of the SWR bridge, but which may or may not match the diameter of a center conductor of a connector of the particular group.

FIG. 7 shows a cross section for the support bead assemblies 404A and 404B of the respective connector saving adapters of FIGS. 4A and 4B. The support bead includes a center dielectric portion 700 which supports the center conductor in a metal barrel 702 which is captured by the outer conductors 400A and 400B of FIG. 4.

With an adapter having a center conductor and an outer conductor with dimensions set so that the adapter electrically matches with one connector type in a group, the adapter will not electrically match other connector types in the group. For instance, in the first group, which includes 3.5 mm, SMA and 2.92 mm connectors, with the adapters configured to mechanically mate and electrically match a 2.92 mm connector, an electrical mismatch will occur when the adapter is connected to a SMA or a 3.5 mm connector.

Figure 8A:
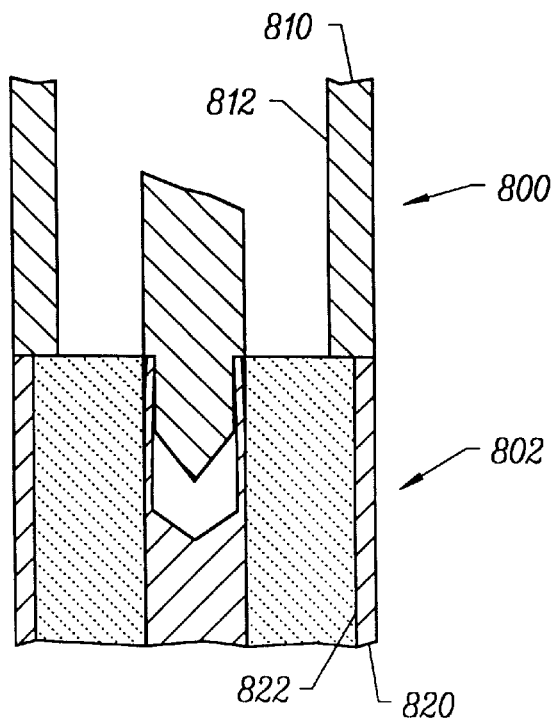
FIG. 8A shows a cross section of a portion of an adapter having an outer conductor with dimensions of a 2.92 mm connector mating with an SMA female connector.

To illustrate, FIG. 8A shows a cross section of a portion of an adapter 800 having an outer conductor with dimensions of a 2.92 mm connector mating with an SMA female connector 802. As shown, the 2.92 mm connector has an outer conductor 810 with an interior conducting portion 812 having a different diameter than the interior conducting portion 822 of the outer conductor 820 of the SMA connector. With interior conducting portions of the two conductors having different diameters, a capacitive mismatch occurs at the interface. The present invention provides two alternatives to compensate for such a capacitive mismatch.

Figure 8B:
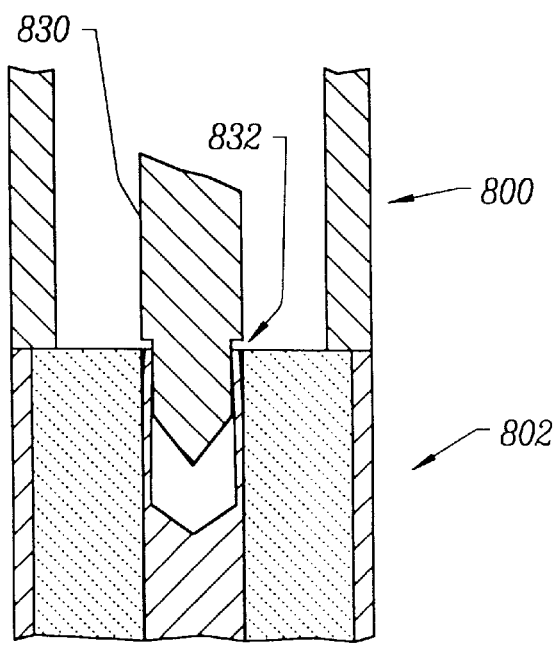
FIG. 8B shows the cross section of mating portions of the 2.92 mm male connector of an adapter and an SMA female connector, similar to FIG. 8A, but with the center pin of the 2.92 mm connector portion of the adapter having a pin setback.

FIG. 8B illustrates a first alternative wherein a center conductor pin setback 832 is used to compensate for a capacitive mismatch. FIG. 8B shows the cross section of mating portions of a 2.92 mm male connector of an adapter 800 and an SMA female connector 802, similar to FIG. 8A, but with the center pin 830 of the 2.92 mm connector having a pin setback 832. Compensating for a capacitive mismatch using the pin setback 832 is described in detail in Oldfield, "New Connector Relieves Nagging SMA Measurement Problems", *Microwaves,* November, 1978.

Figure 8C:
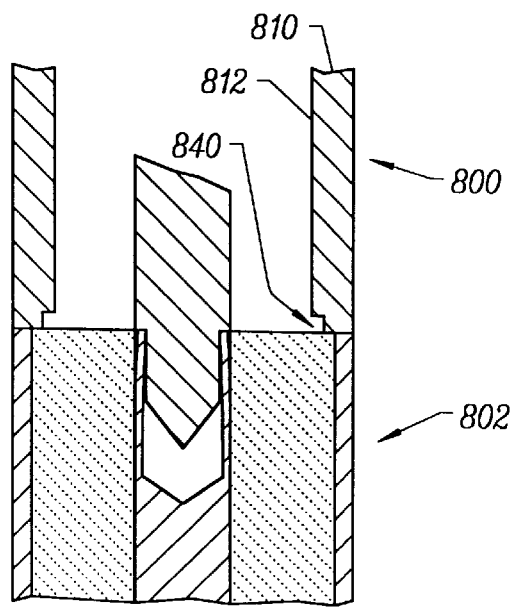
FIG. 8C shows the cross section of mating portions of the 2.92 mm male connector of an adapter and an SMA female connector, similar to FIG. 8A, but with an inductive counter bore in the outer conductor of the 2.92 mm connector.

FIG. 8C illustrates a second alternative wherein the interior conductive portion of the outer conductor of an adapter includes an inductive counter bore to compensate for a capacitive mismatch. FIG. 8C shows the cross section of mating portions of a 2.92 mm male connector 800 and an SMA female connector 802, as in FIG. 8A, but with the interior conducting portion 812 including the inductive counter bore 840.

A third alternative for providing compensation for a capacitive mismatch includes a combination of the pin setback shown in FIG. 8B and the inductive counter bore of FIG. 8C.

Thus, to provide adapters for each connector type in a particular group, a first adapter is configured with an outer conductor and center conductor pin having dimensions so that the adapter will mechanically mate and electrically match with one connector type in the particular group. Additional adapters of the same sex may further be provided for remaining connector types in the particular group, each adapter having an outer conductor with dimensions identical to the first adapter, but a center conductor pin setback, or an inductive counter bore in the outer conductor, or a combination of pin setback and inductive counter bore to provide an electrical match to the connector type to which it is designed to mate. Adapters which mate with connectors of the opposite sex from the first adapter can be provided in a similar manner.

Thus, for the first group of connectors, one SWR bridge can provide full compensation with six adapters, each adapter configured to electrically match one of the 3.5 mm, SMA and 2.92 mm connectors in both male and female versions.

Figure 9:
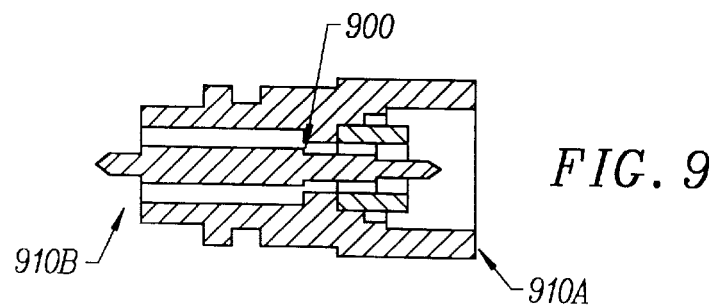
FIG. 9 shows a cross section of the adapter of FIG. 4A with an additional step interface to enable an electrical match between connectors from two different groups.

Although connectors from two separate groups do not mechanically mate, the present invention enables utilization of adapters of different sizes on a single SWR bridge. Due to the different sized adapters, a complete electrical match cannot be provided for both groups because adapters which mate with the test port connector of one particular group will require an additional step interface 900, as illustrated in FIG. 9, rather than a uniform bore diameter forming the interior conducting portion of the outer conductor, as in FIG. 4A. Note that although the step interface 900 of FIG. 9 provides a step up from a connector portion 910A, which may connect to a test port, to a larger connector portion 910B, a transition from the connector portion 910A may step down to a smaller connector portion.

To provide adapters for two groups of connectors for a single SWR bridge, in one embodiment of the present invention, full compensation is provided in the opposite branch of the SWR bridge for adapters of one group of connectors, while the second group remains only substantially compensated due to the step interface. In another embodiment, compensation is provided substantially for adapters of both groups, neither group being fully compensated, but with overall compensation improved.

Thus, with the present invention, one SWR bridge can be provided with substantial compensation for ten adapters, each adapter configured to match one of 3.5 mm, SMA, 2.92 mm, 2.5 mm and 1.85 mm connectors, both male and female versions.

Figure 2:
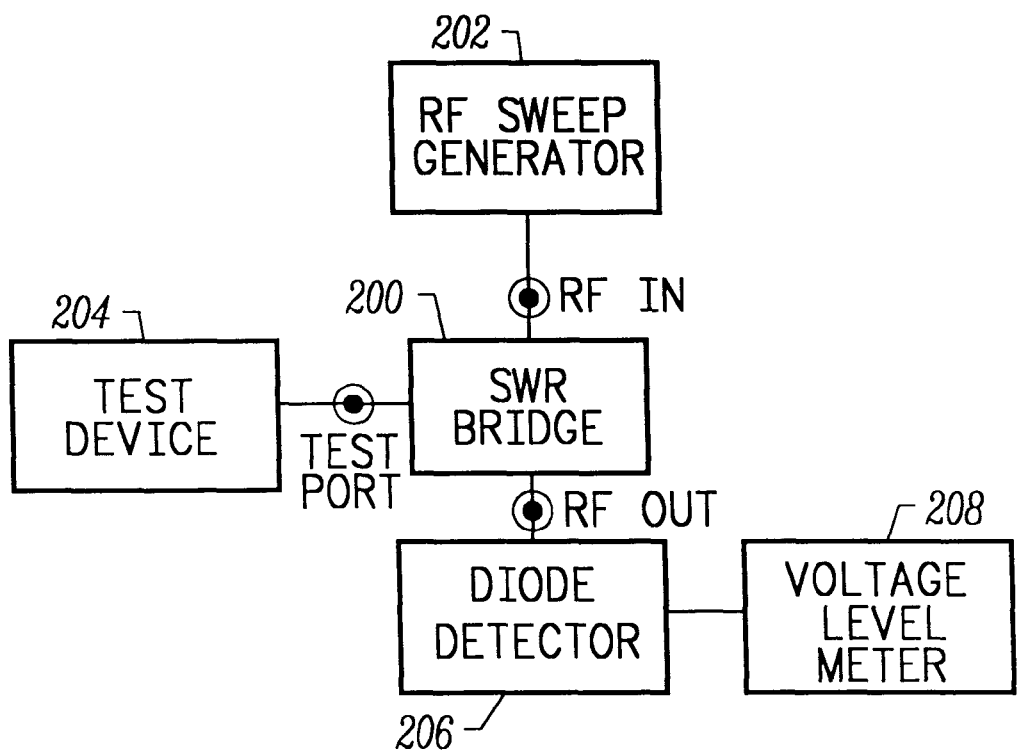
FIG. 2 shows a block diagram of equipment configured for making scaler measurements with an SWR bridge.

The SWR bridge of the present invention, therefore, will provide measurements in a scaler mode, as described with respect to FIG. 2, without requiring a different SWR bridge for each connector type to avoid adapter mismatch. Utilization of the SWR bridge and connector saving adapters of the present invention to make scaler measurements, thus, provides an even lower cost alternative to conventional SWR bridges for making vector SWR measurements as compared to a VNA.

Figure 10:
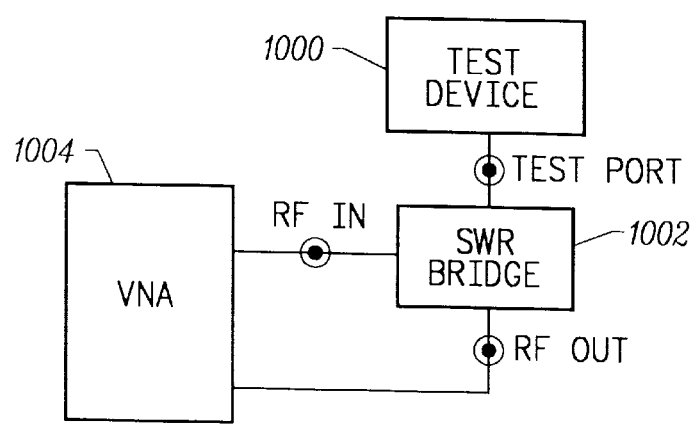
FIG. 10 shows a block diagram of equipment configured for making vector measurements through an SWR bridge using a VNA.

Although the SWR bridge of the present invention is particularly useful in a scaler mode, the present invention also provides improved utility when making vector SWR measurements through an SWR bridge using a VNA. FIG. 10 shows a block diagram of equipment configured for making vector measurements of a test device 1000 through an SWR bridge 1002 of the present invention using a VNA 1004. To make measurements using a VNA with the present invention, the VNA is first calibrated to remove any mismatch due to a particular one of the connector saving adapters. SWR measurements are then made by the VNA 1004 by comparing the signal provided to the SWR bridge 1002 to the signal received from the SWR bridge 1002 output with the VNA 1004 utilizing the calibration to remove any mismatch of the particular adapter. Measurements may then further be made using the VNA 1004 and SWR bridge 1002 using other connector saving adapters matching connectors in the same group as the particular connector saving adapter without recalibration of the VNA because, as discussed above, the electrical characteristics of the connector saving adapters will be identical.

Note that with conventional SWR bridges and adapters, the mismatch of an adapter can be calibrated out, but use of different adapters will require cumbersome recalibration for each adapter, unlike with the present invention.

Although the invention has been described above with particularity, this was merely to teach one of ordinary skill in the art how to make and use the invention. Many modifications will fall within the scope of the invention, as that scope is defined by the following claims.

What is claimed is:

1. An SWR bridge including a plurality of interconnected branches comprising:
   a first branch including a test port connector connectable to a connector saving adaptor, the connector saving adapter having a particular impedance; and
   a second branch element having a fixed impedance with at least a given portion of the fixed impedance substantially matching the particular impedance of the connector saving adapter.

2. The SWR bridge of claim 1, wherein the SWR bridge receives an RF input signal, and wherein the branches further comprise:
   a third branch element having an impedance Ro connected in series with the first branch element, the third branch element being connected to receive the RF input signal; and
   a fourth branch element having the impedance Ro connected in series with the second branch element, the fourth branch element being connected to receive the RF input signal,
   wherein the second branch element has the impedance Ro plus the particular impedance of the connector saving adapter.

3. The SWR bridge of claim 2, wherein the second branch element includes an element having an impedance Ro connected in series with the connector saving adapter.

4. The SWR bridge of claim 2 further comprising a coupling means having a first terminal connected between the first and third branch elements and a second terminal connected between the second and fourth branch elements, the coupling means providing the impedance Ro between its first and second terminals, the coupling means having a third terminal providing an electrical signal at an SWR bridge output proportional to a voltage difference between the first and second coupling means terminals.

5. The SWR bridge of claim 4 wherein the impedance Ro is 50 ohms.

6. The SWR bridge of claim 4 wherein the coupling means comprises a balun.

7. The SWR bridge of claim 4 wherein the coupling means comprises a detector.

8. The SWR bridge of claim 1 wherein the connector saving adapter is one of a plurality of adapters comprising:
   a first adapter having a first end which mechanically mates with the test port connector of the SWR bridge and a second end which mechanically mates with a first type connector with an electrical match and which mechanically mates with a second type connector with an electrical mismatch; and
   a second adapter having a first end which mechanically mates with the test port connector of the SWR bridge and a second end which mechanically mates with the second type connector with an inductive element to create an electrical match.

9. The SWR bridge of claim 8, wherein the inductive element of the second adapter comprises a set back of a center conductor pin of the second adapter.

10. The SWR bridge of claim 8, wherein the inductive element of the second adapter comprises an inductive counter bore in an interior conducting portion of an outer conductor of the second adapter.

11. The SWR bridge of claim 8, wherein the inductive element of the second adapter comprises:
   a set back of a center conductor pin of the second adapter; and
   an inductive counter bore in an interior conducting portion of an outer conductor of the second adapter.

12. The SWR bridge of claim 8, wherein the first and second type connectors include separate ones of the following connectors in either male or female versions: 3.5 mm; SMA; and 2.92 mm.

13. The SWR bridge of claim 8, wherein the first and second type connectors include separate ones of the following connectors in either male or female versions: 2.5 mm; and 1.85 mm.

14. The SWR bridge of claim 8, wherein the plurality of adapters further comprise:
   a third adapter having a first end which mechanically mates with the test connector and a second end which mechanically mates with a third type connector with an electrical match, but does not mechanically mate with the first or second type connector, the third adapter having an additional step interface between its first end and second end in comparison with the first and second adapter so that the given portion of the impedance of the second branch element matches more closely to the first and second adapters than to the third adapter.

15. The SWR bridge of claim 14 wherein the first and second type connectors include separate ones of 3.5 mm, SMA and 2.92 mm connectors, either in male or female versions, while the third type connector includes 2.5 mm and 1.85 mm connectors, either in male or female versions.

16. The SWR bridge of claim 14 wherein the first and second type connectors include separate ones of 2.5 mm and 1.85 mm connectors, either in male or female versions, while the third type connector includes 3.5 mm, SMA and 2.92 mm connectors, either in male or female versions.

17. An SWR bridge having an SWR bridge input terminal for receiving an RF input signal, an SWR bridge output terminal for providing an SWR bridge output signal, and a test port connector connectable to a connector saving adapter having a particular impedance, the SWR bridge comprising:
    a first branch element having an impedance Ro, the first branch element having a first end connected to the SWR bridge input terminal and a second end;
    a second branch including the test port connector, the test port connector having a first end connected to the second end of the first branch element and a second end connected to ground;
    a third branch element having the impedance Ro, the first branch having a first end connected to the SWR bridge input terminal and a second end;
    a fourth branch element including a fixed impedance with at least a given portion of the fixed impedance substantially matching the particular impedance of the connector saving adapter, the fourth branch element having a first end connected to the second end of the third branch element and a second end connected to ground; and
    a coupling means having a first terminal connected to the second end of the first branch element and a second terminal connected to the second end of the third branch element, the coupling means providing the impedance Ro between its first and second terminals, the coupling means having a third terminal connected to the SWR bridge output terminal for providing a signal proportional to a voltage difference between the first and second coupling means terminals.

18. The SWR bridge of claim 17 wherein the connector saving adapter is one of a plurality of adapters comprising:
    a first adapter having a first end which mechanically mates with the test port connector of the SWR bridge and a second end which mechanically mates with a first type connector with an electrical match and which mechanically mates with a second type connector with an electrical mismatch; and
    a second adapter having a first end which mechanically mates with the test port connector of the SWR bridge and a second end which mechanically mates with the second type connector with an inductive element to create an electrical match.

19. A method of measuring the SWR of a first test device and a second test device comprising:
    calibrating a VNA with the connector saving adaptor of claim 18 attached to remove mismatches due to the connector saving adaptor;
    connecting the first test device through the connector saving adaptor of claim 18 to the test port of the SWR bridge of claim 18, with the SWR bridge being connected to test ports of a VNA, and comparing a signal provided to the SWR bridge from the VNA with a signal received from the SWR bridge by the VNA utilizing the calibration to determine SWR of the first test device; and
    connecting the second test device through a second one of the plurality of adapters of claim 18, other than the connector saving adapter, to the test port of the SWR bridge, with the SWR bridge being connected to test ports of a VNA, and comparing a signal provided to the SWR bridge from the VNA with a signal received from the SWR bridge by the VNA utilizing the calibration to determine SWR of the second test device.

20. A kit for measuring parameters of microwave devices comprising:
    a plurality of adapters for connecting the microwave devices to a test port connector, each of the plurality of adapters having a first impedance, the plurality of adapters comprising:
        a first adapter having a first end which mechanically mates with the test port connector and a second end which mechanically mates with a first type connector on one of the microwave devices with an electrical match and which mechanically mates with a second type connector on one of the microwave devices with an electrical mismatch;
        a second adapter having a first end which mechanically mates with the test port connector and a second end which mechanically mates with the second type connector with an inductive element to create an electrical match; and
    an SWR bridge including a plurality of interconnected branches comprising:
        a first branch including the test port connector of the SWR bridge which mates with a connector of each of the plurality of adapters; and
        a second branch element which includes an adapter substantially identical to one of the plurality of adapters.

21. The kit of claim 20, wherein the SWR bridge receives an RF input signal, and wherein the branches further comprise:
    a third branch element having an impedance Ro connected in series with the first branch element, the third branch element being connected to receive the RF input signal; and
    a fourth branch element having the impedance Ro connected in series with the second branch element, the fourth branch element being connected to receive the RF input signal,
    wherein the second branch element further includes a component having the impedance Ro.

22. The kit of claim 20, wherein the inductive element of the second adapter comprises a set back of a center conductor pin of the second adapter.

23. The kit of claim 20, wherein the inductive element of the second adapter comprises an inductive counter bore in an interior conducting portion of an outer conductor of the second adapter.

24. The kit of claim 20, wherein the plurality of adapters further comprise:
    a third adapter having a first end which mechanically mates with the test connector and a second end which mechanically mates with a third type connector with an electrical match, but does not mechanically mate with the first or second type connector, the third adapter having an additional step interface between its first end and second end in comparison with the first and second adapter so that the given portion of the impedance of the second branch element matches more closely to the first and second adapters than to the third adapter.

25. The kit of claim 24 wherein the first and second type connectors include separate ones of 3.5 mm, SMA and 2.92 mm connectors, either in male or female versions, while the third type connector includes 2.5 mm and 1.85 mm connectors, either in male or female versions.

26. The kit of claim 24 wherein the first and second type connectors include separate ones of 2.5 mm and 1.85 mm connectors, either in male or female versions, while the third type connector includes 3.5 mm, SMA and 2.92 mm connectors, either in male or female versions.

* * * * *